(12) United States Patent
Garnache et al.

(10) Patent No.: US 6,741,629 B1
(45) Date of Patent: May 25, 2004

(54) OPTICAL TRANSMITTER HAVING OPTICALLY PUMPED VERTICAL EXTERNAL CAVITY SURFACE EMITTING LASER

(75) Inventors: Arnaud Garnache, Montpellier (FR); Alexandre Katchanov, Sunnyvale, CA (US); Barbara Paldus, Sunnyvale, CA (US); Daniele Romanini, Grenoble (FR); Frederic Stoeckel, Vaulnaveys le Haut (FR)

(73) Assignee: Blueleaf, Inc., Sunnyvale, CA (US)

( * ) Notice: Subject to any disclaimer, the term of this patent is extended or adjusted under 35 U.S.C. 154(b) by 0 days.

(21) Appl. No.: 09/668,905

(22) Filed: Sep. 22, 2000

(51) Int. Cl.[7] .............................................. H01S 5/183
(52) U.S. Cl. .............................. 372/96; 372/20; 372/70; 372/99
(58) Field of Search ............................... 372/20, 36, 70, 372/92, 99, 45

(56) References Cited

U.S. PATENT DOCUMENTS

2002/0048301 A1 * 4/2002 Wang et al. ................... 372/45

* cited by examiner

Primary Examiner—James Davie
(74) Attorney, Agent, or Firm—John F. Schipper; Herbert G. Burkhard

(57) ABSTRACT

An optical fiber transmitter comprises an optically pumped single mode MQW VECSEL for emitting an information-carrying laser beam and has an external cavity length defining a comb of optical modes, each mode corresponding to a channel wavelength of an optical telecommunications system having plural optical channels. A semiconductor structure of the VECSEL has an optical-pump-excited multiple quantum well (MQW) homogeneously broadened gain region active over a band which is less than mode-to-mode spacing, the gain region being tunable to hop from a first mode to an adjacent second mode. A tuning arrangement tunes the VECSEL from mode to mode thereby to select each one of the plural optical channels. An optical modulator adds modulation to a beam emitting from the laser to provide the information-carrying laser beam, and a coupler couples the information-carrying laser beam into an optical fiber of the optical telecommunications system. A calibration method based on detecting inter-mode optical transitions (mode hopping) is described.

18 Claims, 5 Drawing Sheets

OPTICAL TRANSMITTER HAVING OPTICALLY PUMPED VERTICAL EXTERNAL CAVITY SURFACE EMITTING LASER

FIELD OF THE INVENTION

The present invention relates to an optically-pumped external cavity surface emitting laser emitting single spatial and longitudinal mode radiation at selected wavelengths over a frequency comb. More particularly described are the laser design, manufacturing and assembly processes for optical fiber telecommunications.

BACKGROUND OF THE INVENTION

Practical semiconductor lasers generally follow two basic architectures. The first laser type has an in-plane cavity, and the second laser type has a vertical cavity, a so-called vertical-cavity surface-emitting laser or "VCSEL". If the optical resonance cavity is formed externally of the semiconductor structure, the laser is known as a vertical external cavity surface-emitting laser or "VECSEL". Electrically pumped diode lasers are most frequently of the in-plane cavity type. Necessary optical feedback within the in-plane type is most frequently provided by simple cleaved-facet mirrors at each end of the optical cavity. The reflectance of such cleaved mirrors, while sufficient is not very high, and laser energy is emitted through the cleaved mirrors to the external ambient at opposed edges of the structure, giving rise to "edge-emitting" diode lasers. Such relatively simple structures are sometimes referred to as Fabry-Perot diode lasers. Epitaxial patterning of a grating pattern along a top surface of the edge-emitting diode laser is frequently provided to set a design wavelength, resulting in a distributed feedback diode laser or "DFB".

In-plane electrically pumped (PIN diode) lasers, such as DFB lasers, are typically single mode, and are also typically tunable continuously across some wavelength band from near-infrared and into the visible light spectrum. Rapid tuning may be carried out by controlling the electrical pumping current, while slow tuning may be carried out by controlling the temperature of the laser via a heat sink and a thermal cooler/heater arrangement. In-plane lasers have many known uses including optical wavelength absorption spectroscopy, storage, printing and telecommunications. In-plane lasers are frequently employed within telecommunications systems using optical fiber as the information transfer medium. Conventionally, multiple channels are carried through a single optical fiber, and it is therefore necessary when using a Fabry-Perot diode laser or a DFB laser as the illuminating source to regulate the wavelength of the transmitting laser in order to stay on a selected channel.

In order to keep a diode laser tuned to a desired wavelength, complex current and thermal control loops must be provided to stabilize the laser at the desired wavelength, particularly as the laser ages during usage. Also, there is no absolute wavelength stabilization within these in-plane lasers, and the emission wavelength may drift, without careful feedback control, during usage and over the useful lifetime of the laser device. This tendency to drift or change characteristics with temperature and over time puts extremely stringent conditions on the materials used to make the laser.

One known drawback of in-plane diode lasers, and most particularly the Fabry-Perot type, is that it can manifest a tendency to mode-hop. Mode-hopping basically means that for a given pumping current, unexpectedly the laser can hop to a completely different mode (wavelength). As the current is increased, there are wavelengths at which the mode hopping or wavelength jumping becomes uncontrollable. Moreover, diode lasers may manifest a hysteresis, in that mode hopping may occur at different wavelengths during control current increases than the mod-hopping wavelengths encountered during control current decreases. Another drawback of in-plane diode lasers is that output power is inextricably intertwined with active region temperature and pumping current. Another issue with in-plane diode lasers is that the transverse optical beam profile is typically elliptical rather than circular and has high divergence, increasing the complexity of coupling the laser energy into the optical fiber, such as with precision gluing of tiny aspheric lenses at the laser-fiber interface.

Dense wavelength division multiplexing (DWDM) for optical fiber telecommunications applications require optical transmitters that can be tuned to any frequency in the standard ITU "grid" (wavelength comb) with a relative frequency error not greater than ten percent of the ITU channel spacing. This requirement implies that an optical transmitter laser has extreme frequency stability as well as broad tunability. For a 12.5 GHz channel spacing, the transmitter must have 1.25 GHz of absolute accuracy and frequency (wavelength) stability. Such control of the lasing frequency cannot be achieved with existing DFB lasers without complex electronic control and frequently carried out diagnostics. Furthermore, compensation algorithms must be developed in the laser control to handle the DFB's known aging processes, which is often unpredictable.

Another requirement for an ideal DWDM optical transmitter is that a single laser can cover all of the DWDM channels, and that it can be reliably and reproducibly set to any one of the standard channel frequencies. Practically, a laser source will only have a limited tuning range, which covers only a fraction of the full ITU grid. Existing telecommunications DFB lasers have limited tunability; and, the temperature tuning coefficient of telecom DFB lasers is typically 0.09 nm/° C. For a DFB laser thermal operating range of +20° C., or 40° C. total temperature differential, one DFB laser could only be expected to cover a wavelength range of 3.6 nm (or about 460 GHz, representing only four channel coverage with 100 GHz channel spacing or 36 channel coverage with 25 GHz spacing) provided that necessary accuracy in wavelength could be achieved.

In addition, DFB lasers only have about 30 to 35 dB of side mode suppression. If the side modes are not sufficiently controlled, the laser may excite two or three adjacent communications channels, resulting in unwanted interference. Because of these drawbacks, the telecommunications industry has recently turned to VCSELs.

Micro-cavity VCSELs include semiconductor structures which have multiple layers epitaxially grown upon a semiconductor wafer/substrate, typically Gallium Arsenide or Indium Phosphide. The layers comprise semiconductor or dielectric Bragg mirrors which sandwich layers comprising quantum well active regions. Within the VCSEL photons emitted by the quantum wells bounce between the mirrors and then are emitted vertically from the wafer surface. The VCSEL type laser naturally has a circular dot geometry with lateral dimensions of a few microns. The emitting aperture of a few microns facilitates direct-coupling to optical fibers or other simple optics, since the narrow aperture typically supports only a single lateral mode ($TEM_{00}$) of the resulting optical waveguide, but is sufficiently wide to provide an emerging optical beam with a relatively small diffraction angle. Recently, a 1.3 micron VCSEL was said to be developed by Sandia National Laboratories in conjunction with Cielo Communications, Inc. According to a news report, "This new VCSEL is made mostly from stacks of layers of semiconductor materials common in shorter wavelength lasers . . . aluminum gallium arsenide and gallium arsenide. The Sandia team added to this structure a small amount of a new material, indium gallium arsenide nitride (InGaAsN), which was initially developed by Hitachi of Japan in the mid 1990s. The InGaAsN causes the VCSEL's operating wavelength to fall into a range that makes it useable in high-speed Internet connections." ("'First ever'1.3 micron VCSEL on GaAs", Optics.Org Industry News, posted June 16, 2000). One of the characteristics of micro-cavity VCSELs is that the laser cavity is formed entirely within the semiconductor structure. One drawback of such VCSELs is that they do not generate very much power, on the order of 3 mw for a small aperture of 5 $\mu$, for example. Also, there is transverse spatial hole burning between the transverse modes above 3 mw, for example.

As mentioned above, if a cavity is formed which is external to the semiconductor structure having the quantum well active region, it is known as a VECSEL. A VECSEL epitaxially grown semiconductor body typically has a few microns thick multiple quantum well active gain region sandwiched between a Bragg mirror grown on a semiconductor substrate and an antireflection coating that is either epitaxially grown or dielectrically deposited. An external high reflectivity dielectric concave mirror is then added to form an external optical cavity One example of an optically pumped VECSEL is described in Published International Patent Application WO 00/10234, entitled "Optically-Pumped External-Mirror Vertical-Cavity Semiconductor-Laser", the disclosure thereof being incorporated herein by reference. The disclosed VECSEL includes an epitaxially-grown semiconductor structure or chip having a multiple-layer mirror structure integrated with a multiple-layer quantum-well structure which provides a gain medium, and an external mirror forming a resonant cavity with the integrated semiconductor multilayer mirror. Optical pumping radiation is directed at the quantum-well structure via an outermost or top layer and is absorbed by the quantum-well and pump-absorbing layers. The quantum-well layers release photons in response to the pumping energy, and the external cavity is dimensioned to result in laser energy output at an approximate 976 nm wavelength in response to pumping energy at a wavelength of approximately 808 nm. Because this VECSEL operates at wavelengths below 1.1 $\mu$ in the visible light spectrum, the active gain medium is made to be aluminum-free, since aluminum ions tend to diffuse in GaAs materials-based lasers. Accordingly, the quantum-well and pump-radiation absorbing layers are aluminum-free layers of alloys of gallium arsenide and indium gallium arsenide phosphide (GaAs/InGaAsP). One drawback of the VECSEL described in this published International Patent Application is the absence of any wavelength tuning mechanism enabling adjustment of the laser emission wavelength.

Other VECSELs are described, inter alia, in a paper by Sandusky and Brueck, entitled: "A CW External-Cavity Surface-Emitting Laser", IEEE Photonics Tech. Ltrs., Vol. 8, No. 3, March 1996, pp. 313–315; and, in a paper by Kuznetsov, Hamimi, Sprague, and Mooradian, entitled: "High Power (>0.5-W CW) Diode-Pumped Vertical-External-Cavity Surface-Emitting Semiconductor Lasers with Circular TEM$_{00}$ Beams", IEEE Photonics Tech. Ltrs., Vol. 9, No. 8, August 1997, pp. 1063–1065.

Co-inventors Garnache and Kachanov of the present invention have previously reported in a note entitled "High-sensitivity intracavity laser absorption spectroscopy with vertical-external-cavity surface-emitting semiconductor lasers", Optics Letters, Vol. 24, No. 12, Jun. 15, 1999, pp. 826–828, that an optically pumped multiple-quantum-well ("MQW") VECSEL is an excellent candidate for use in high sensitivity intracavity laser absorption spectroscopy ("ICLAS"). In the ICLAS method an absorbent analyte is placed inside an external cavity of a broadband laser with homogeneously broadened gain. An L-shaped cavity was formed by the integrated Bragg mirror, an external folding mirror having a 150 mm radius of curvature, and a flat output coupler having 0.5 percent transmission placed at the end of a one meter arm of the cavity. The angle between the two arms was reduced to approximately 7 degrees to reduce astigmatism. A 500 mm long intra-cavity absorption cell with Brewster-angle windows and containing an analyte material was placed in the long arm. Generation time was controlled by an optical chopper that interrupts or starts the pump radiation beam and by an acousto-optic modulator that is triggered after an adjustable generation delay time. Further work by these authors with VECSELs in the field of spectroscopy is reported in a paper by Garnache, Kachanov, Stoeckel and Houdre entitled: "Diode-Pumped Broadband Vertical-External-Cavity Surface-Emitting Semiconductor Laser: Application to High Sensitivity Intracavity Laser Absorption Spectroscopy", JOSA-B-B, Vol. 17, No. 9, September 2000, pp. 1589–1598. The disclosures of these two articles are incorporated herein in their respective entireties by this reference thereto.

An intra-cavity etalon and a Lyot filter were said by Holm et al. to stabilize VECSEL radiation at a single wavelength in "Actively Stabilized Single-Frequency Vertical-External-Cavity AlGaAs Laser", IEEE Photonics Technology Letters, Vol. 11, No. 12, December 1999.

As an alternative solution to DFB lasers for telecom, one approach for tuning a VECSEL is described in a note by D. Vakhshoori, P. Tayebati, Chih-Cheng Lu, M. Azimi, P. Wang, Jiang-Huai Zhou and E. Canoglu entitled, "2 mW CW single mode operation of a tunable 1550 nm vertical cavity surface emitting laser with 50 nm tuning range", published in Electronics Letters, Vol. 35, No. 11, May 27, 1999, pp. 900–901, the disclosure thereof being incorporated herein by reference. This laser design is grown epitaxially upon an indium phosphide substrate and has a cavity formed by a distributed Bragg reflector (DBR), a multiple quantum well (MQW) active gain region, and an external dielectric membrane mirror at a relatively short (~7 $\mu$) distance from the active gain region. Because the VECSEL laser cavity is so short, only one cavity mode can fit into the bandwidth of the MQW gain structure. Cavity length can be changed by applying a potential difference between the dielectric membrane and the ambient supporting structure (heatsink), thereby applying an electrostatic force to the membrane mirror and causing its curvature (and hence the cavity length) to change. Changing the cavity length shifts the cavity resonance frequency which results in laser frequency tuning. The VECSEL is optically pumped by a 980 nm diode laser which can be epitaxially grown below the DWDM laser. The authors and an associated company, Coretek, have reported continuous tuning of this VECSEL over a range of about 50 nm, which is more than 10 times the tuning range of a typical DFB laser. This Coretek VECSEL is said to have a high quality TEM$_{00}$ transverse mode and more than 50 dB of side mode suppression.

The Coretek VECSEL does not appear to meet the DWDM telecom requirements, however. First, the tuning voltage of 40 V that is needed for 50 nm wavelength tuning is too high for most telecom applications. Moreover, the micro-machined membrane mirror must be reasonably flexible in order to move the required tuning distance, and is necessarily sensitive to external perturbations or vibrations and also will become self-excited into undesirable vibrational modes by actuation. This system is very complex to produce, with evident difficulties of a multilayer epitaxial structure being compounded by the need to form, align and attach a precision micro-machined membrane external mirror. Thus, workable Coretek VECSELs would be very challenging to manufacture at a reasonable cost and yield in mass production. Furthermore, a complex feedback control system would be requried to maintain membrane mirror position, thereby limiting absolute frequency set point stability and reproducibility in laser tuning.

From the foregoing description of the state of the art, it is apparent that a hitherto unsolved need has remained for a simplified, reproducible and widely tunable single mode MQW VECSEL for optical fiber telecommunications in a manner overcoming the limitations and drawbacks of the prior approaches.

SUMMARY OF THE INVENTION WITH OBJECTS

One object of the present invention is to realize an optical fiber transmitter module including a single mode MQW VECSEL having a semiconductor structure with a homogeneously broadened active gain region and an external mirror spaced from the semiconductor structure by a spacer such that a cavity length is in a range of 0.5 mm and 50 mm and is chosen to create a laser frequency comb corresponding to a predetermined optical channel spacing arrangement.

Another object of the present invention is to realize a MQW VECSEL semiconductor structure formed by molecular beam epitaxy in a manner enabling removal of the semiconductor substrate, thereby overcoming limitations and drawbacks of prior approaches in which the substrate contributed to the presence of a Fabry-Perot etalon or other unwanted optical element.

Yet another object of the present invention is to realize a laser with reproducible absolute wavelengths that correspond only to standardized wavelength division multiplex (WDM) channel wavelengths as used in optical fiber telecommunications networks, such that the laser steps from channel to channel and such that by design the absolute channel wavelengths of this laser are ensured to hit the channel wavelength exactly, that is have exact channel separation and exact channel wavelength with accuracy better than ten percent of channel spacing.

One more object of the present invention is to realize an optically pumped MQW VECSEL having sidemode suppression well in excess of 40 dB.

In accordance with aspects of the present invention, an optically pumped single mode MQW VECSEL includes a heat sink structure and a semiconductor structure grown by molecular beam epitaxy upon a substrate and attached to the heat sink. As completed, the semiconductor structure essentially comprises a multi-layer semiconductor mirror region, such as a Bragg mirror achieving at least 99 percent reflectance, a homogeneously broadened multiple quantum well active gain region having a length equal to at least one design wavelength and having a plurality of quantum wells, each quantum well being optimally positioned respect to a standing wave in the active gain region at the design wavelength, and an antireflection coating region having a low reflectance at the design wavelength. An external spherical mirror is positioned relative to the semiconductor structure by a spacer structure mounted to the heat sink at a distance in a range of 0.5 mm and 50 mm to form the external cavity and chosen to create a laser frequency comb corresponding to a predetermined optical channel spacing arrangement. Preferably, an in-plane laser (e.g. Fabry Perot or DFB laser diode) providing pump radiation is aligned relative to an external surface of the semiconductor at Brewster's angle formed relative to an axis of laser emission. In this aspect the laser diode pump is a sub-assembly which is aligned and secured in a sidewall of the spacer and is thereby made integral therewith. A pump radiation absorption element or aperture is preferably formed in the spacer at Brewster's angle opposite an angle of incidence of the pump radiation for absorbing any pump radiation residually reflected from the external surface of the semiconductor.

As another aspect of the present invention an optical fiber transmitter comprises an optically pumped single mode VECSEL for emitting an information-carrying laser beam at a design wavelength and has an external cavity length defining a plurality of optical modes, each mode corresponding to a channel wavelength of an optical telecommunications system having plural optical channels. A semiconductor structure of the VECSEL has an optical-pump-excited, homogeneously broadened multiple quantum well (MQW) active region wherein the gain curve exceeds cavity losses over a band which is less than mode-to-mode spacing, the gain region being tunable to step from a first mode to an adjacent second mode and to remain stably at the adjacent second mode. A tuning arrangement tunes the VECSEL from mode to mode thereby to select each one of the plural optical channels. A conventional optical amplitude modulator adds user traffic to a beam emitting from the laser to provide the information-carrying laser beam, and a coupler couples the traffic-carrying laser beam into an optical fiber of the optical telecommunications system.

A method for calibrating a VECSEL is provided. The VECSEL includes an external cavity formed by an external mirror at a length fixed by a spacer. The length defines a plurality of optical modes, each mode corresponding to a channel wavelength of an optical telecommunications system having plural optical channels. The semiconductor structure of the VECSEL has an optical-pump-excited, homogeneously broadened multiple quantum well (MQW) active region wherein the gain curve exceeds cavity losses over a band which is less than mode-to-mode spacing, the gain region being tunable to step from a first mode to an adjacent second mode and to remain stably at the adjacent second mode. A tuning mechanism such as a thermoelectric cooler for cooling and heating the active gain region, or a frequency-selective element such as an intra-cavity etalon, is provided for tuning the VECSEL from mode to mode. A digital controller including a wavelength-selective optical sensor responsive to VECSEL output radiation tunes the VECSEL from mode to mode and maintains the VECSEL at each mode thereby to select each one of the plural optical channels. The wavelength-selective optical sensor generates pulses responsive to inter-mode optical transitions. The method includes steps of:

sweeping the tuning mechanism between a longest wavelength mode capable of being generated by the VECSEL and a shortest wavelength mode capable of being generated by the VECSEL in accordance with a control parameter generated by the digital controller, recording in a memory of the digital controller a transition control parameter presently being put out by the wavelength-selective optical sensing means upon detection of pulses responsive to inter-mode optical transitions, and determining and recording single mode set values as approximately half increment magnitudes between magnitudes of adjacent recorded transition control parameters.

These and other objects, advantages, aspects and features of the present invention will be more fully understood and appreciated by those skilled in the art upon consideration of the following detailed description of preferred embodiments, presented in conjunction with the accompanying drawings.

DETAILED DESCRIPTION OF PREFERRED EMBODIMENTS

Figure 1:
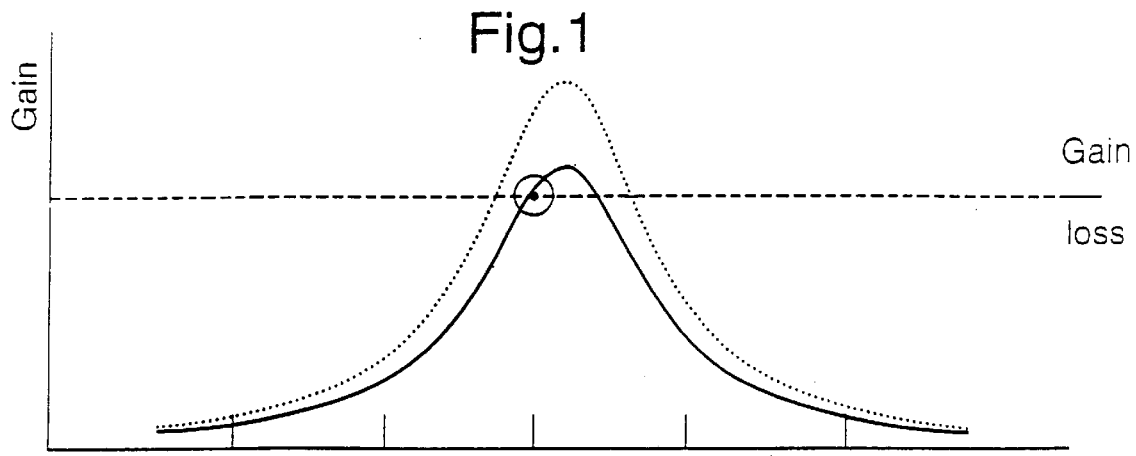
FIG. 1 is a pair of graphs of gain intensity as a function of VECSEL optical mode, showing an initial higher gain and a residual steady state lower gain suitable for exciting a single mode in continuous CW operation, rendering the VECSEL output monomode and very useful for mode switching in optical fiber telecommunications.

The present invention provides a compact, tunable laser source which can be tuned over a range of several tens of nanometer within an optical telecommunications multichannel band plan and which will operate reliably and extendedly on selected ones of the multiple channels thereof (as specified by the International Telecommunications Union (ITU) DWDM grid plan, for example). The laser source is an optically pumped MQW VECSEL having an epitaxially grown MQW gain structure with incorporated distributed Bragg reflector (DBR) and an external dielectric spherical mirror. The external mirror is positioned precisely at a distance L from the MQW structure such that $c/2L = \Delta V_{DWDM}$, where $\Delta V_{DWDM}$ is a required telecom optical channel spacing, such as 12.5 GHz or 25 GHz, for example. For a channel spacing of 25 GHz cavity length L should be 0.6 cm.

Separation between the MQW structure and the external mirror is maintained by a spacer made of a material having a low index of thermal exapnsion, $\alpha$, such as fused silica ($\alpha \sim 10^{-6}$) or Zerodur™, a silica-like material made by Heraeus-Amersil and which can have a thermal expansion coefficient equal to essentially zero over a temperature range of several tens of degrees C. The resultant optical cavity provides a comb of fixed lasing frequencies.

An absolute frequency reproducibility $\Delta v/v = \Delta L/L = \alpha \Delta T$ of $6.3*10^{-6}$ can be realized with a fused silica spacer having only 6° C. temperature stability. In this VECSEL, the external cavity itself serves as an absolute frequency standard (etalon). The spacer length tolerance $\delta L$ should be $L*6.3*10^{-6}=0.04$ $\mu$, or 0.025 of the working wavelength. Such accuracy is well within the existing capability of the optical industry which can make retardation plates to adjust accuracy of a polarization vector with better accuracy than one degree of retardation.

Radius of curvature of the external mirror is derived from the cavity mode diameter at the MWQ structure for a cavity length equal to L. For example, with external mirror spacing L=0.6 cm a cavity mode diameter of 50 $\mu$ will be achieved if the mirror radius of curvature is equal to 0.63 cm. Such mirrors can be manufactured by standard methods known in the optical industry, such as molding the mirrors against a diamond-turned metal preform.

In a preferred embodiment of the present invention, single frequency operation of the VECSEL on a particular telecom channel is achieved: 1) by the homogeneous broadening properties of the MQW gain structure which results in a spectral narrowing of laser output radiation after initial intensity buildup of laser radiation within the cavity, and 2) by laser cavity design in which the active gain structure is positioned at a very small distance (about one wavelength) from the cavity end mirror (DBR). Such a position prevents spatial hole burning effects and favors single frequency operation, even if no additional frequency selection mechanisms (such as intra-cavity etalons or Lyot filters) are provided.

The transient behavior of a VECSEL made of InGaAs strained quantum wells having GaAs barriers has been studied and reported in the articles by co-inventors Garnache, Kachanov, Romanini and Stockel, cited and incorporated in the Background of the Invention, above. For a VECSEL having a homogeneously broadened gain medium with gain bandwidth $\Gamma$ (half-width at half-maximum (HWHM)) and broadband mirrors the intensity $M_q(t_g)$ of a mode q at a time $t_g$ (generation time) which is measured from the instant when pumping started can be described by the following equation (1):

$$M_q(t_g) = M \frac{\sqrt{\eta_g/\pi}}{2L\Gamma} \exp\left[-\left(\frac{q-q_0}{2L\Gamma}\right)^2 \eta_g\right], \quad (1)$$

where $q_0$ is a central mode number, and $\gamma$ is the cavity loss rate. Cavity loss rate $\gamma$ can be described by equation (2):

$$\gamma = -c \ln\lfloor R_{oc}(1-l_i)^2 \rfloor / 2L, \quad (2)$$

where c is the velocity of light, and the cavity has an output coupler having reflectivity $R_{oc}$, and internal loss $l_i$.

From equation (1) it follows that after VECSEL lasing starts, its spectrum will be multimode with the total width close to the gain bandwidth $2\Gamma$, but the intensities of the side modes will decrease exponentially over time so that the spectral width $\Delta v$ (HWHM) will decrease in time inversely proportional to the generation time $t_g$, in accordance with equation (3):

$$\Delta v = \Gamma \sqrt{\ln(2)}/t_g, \quad (3)$$

It has been experimentally confirmed that the condition for validity of equation (1) is that the gain medium of the active region of the VECSEL is homogeneously broadened and that any non-linear interactions between the modes are negligible for a given generation time. If, for a certain laser, the spectral width becomes smaller than cavity mode spacing, and equation (1) remains valid, the laser will collapse to single frequency operation. In the September 2000 *JOSA-B* paper of co-inventors Garnache, Kachanov and Romanini with co-author Houdre, it is shown that for a VECSEL active region comprising a strained InGaAs MQW in GaAs, this equation is valid at least for a generation time $t_g$ as large as one second. If one assumes a reasonable value of gain bandwidth $\Gamma$ as equal to 100 cm$^{-1}$ or 3000 GHz, external coupler reflectivity Roc=0.99 percent, and cavity internal loss li of 0.001, then for a cavity length L of 0.6 cm, the spectrum must collapse to a bandwidth smaller than intermode spacing equal to 25 GHz at a time $t_g$~0.03 ms. This means that the VECSEL will then be lasing single frequency at a mode closest to the gain maximum. This time is much shorter than the time for which equation (1) was experimentally confirmed as reported in the above-referenced article.

Figure 2:
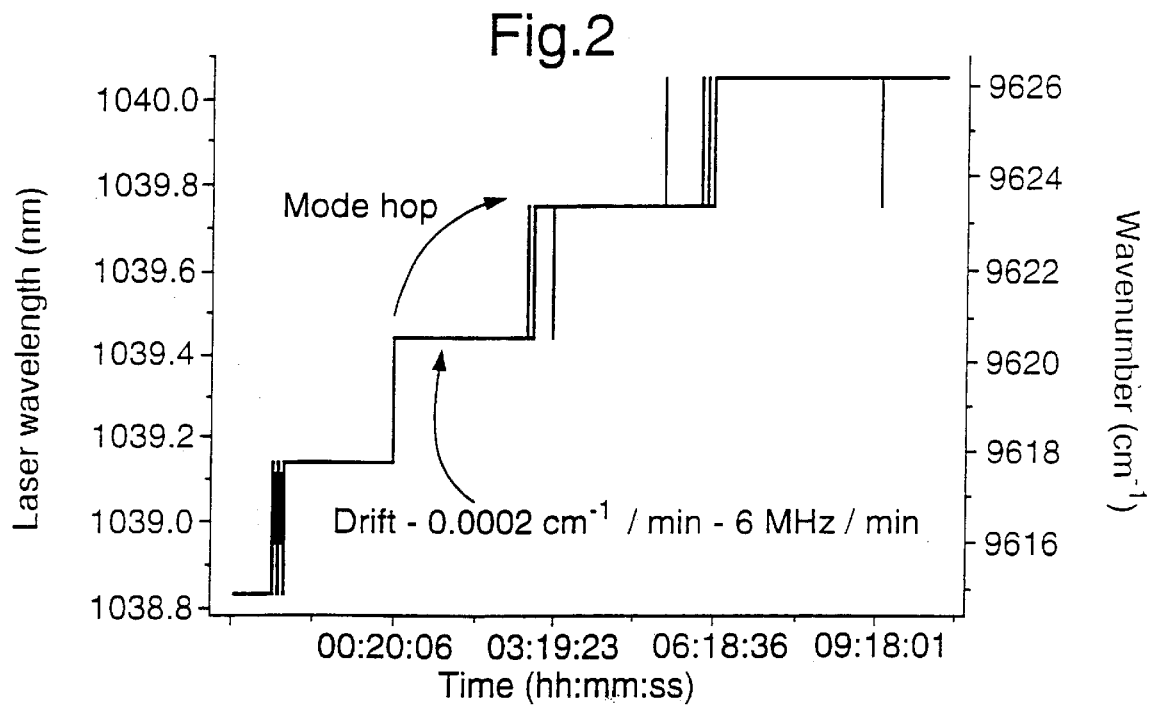
FIG. 2 shows thermally induced mode hopping over extended time intervals of a VECSEL very useful for mode switching in optical fiber telecommunications.

FIG. 1 presents two plots of VECSEL active gain as a function of wavelength and pumping intensity, and marks a series of VECSEL cavity modes (resonances) across the abscissa of the graph. The dotted line shows initial intensity buildup in the cavity which takes place during the initial startup (and which is of particular interest and importance in the ICLAS example given above). After about one microsecond VECSEL active gain becomes clamped to the average cavity losses, and from the solid-line curve of FIG. 1 it is seen that only the mode closest to the gain maximum will be lasing. If unsaturated gain is increased, e.g., by increased pumping radiation power, several modes may be excited, and the VECSEL may oscillate or dither between adjacent modes, as shown at the leftmost region of the FIG. 2 graph. Therefore, by adjusting pumping radiation to an appropriate level, and by thermally decoupling the VECSEL external cavity mirror, FIG. 2 shows that, following an initial mode-switch interval, it is practical by thermal control to move relatively slowly the VECSEL laser output radiation wavelength stably from mode to mode over time. Faster mode selection (<1 ms) may be achieved by providing a controllable intra-cavity element such as an etalon.

Thermally controlled VECSEL mode hopping and stability at each selected mode (following startup phase) over an extended time period (hours) is shown in the FIG. 2 graph. This graph represents data obtained from a VECSEL having a semiconductor structure grown by molecular beam epitaxy on a 0.5 mm GaAs substrate. The bottom stack of the VECSEL is a standard Bragg mirror and consists of 30.5 pairs of AlAs-Al$_{0.27}$Ga$_{0.93}$As quarter-wave layers with a measured reflectance of 99.96 percent at a 1030 nm laser design wavelength. The active region (MQW) consists of two sets of three strained 8-nm In$_{0.2}$Ga$_{0.8}$As quantum wells separated by 10-nm GaAs barriers. Each set of quantum wells is placed at the maximum of the intracavity standing wave. 830-nm optical pump radiation is focused into the GaAs absorbing layers within the gain region (which has an optical thickness of 3½. An AlAs quarter-wave layer followed by an Al$_{0.07}$Ga$_{0.23}$As half-wave layer was grown on top of the active region to prevent carriers from diffusing to the semiconductor surface and to have an Al-poor surface to avoid surface contamination. A Ti:sapphire pump laser emitted 830 nm pump radiation focused into the gallium arsenide absorbing layers within the gain region. The semiconductor chip was soldered onto a copper heat sink and cooled by a Peltier element and a heat radiator under the control of a temperature controller. The optical pump source, the VECSEL structure and the external cavity mirror were mounted onto an aluminum base plate. Tunability was achieved over a range of 1012 to 1086 nm with less than 500 mW of pump power. Further information concerning this particular VECSEL can be found in the paper entitled: "High-sensitivity intracavity laser absorption spectroscopy with vertical-external-cavity surface-emitting semiconductor lasers", by authors Garnache, Kachanov, Stoeckel, and Planel, in *Optics Letters*, Vol. 24, No. 12, Jun. 15, 1999, pp 826–828, cited and incorporated by reference in the Background of the Invention, above.

In accordance with principles of the present invention, and as shown in FIG. 1, after a very short generation time ($t_g$~0.03 ms, for example) the telecommunications VECSEL will operate single frequency on a mode closest to MQW gain peak. The gain (solid bell-shaped line) will be clamped to the cavity loss value (horizontal dashed line) at this operating mode frequency (clamp is denoted by small full circle). If the temperature of the MQW active region is changed, for example by changing the temperature set point value of a thermoelectric cooler (element 112 in FIG. 3) of the VECSEL semiconductor structure, the gain maximum will move to a higher or lower frequency, corresponding to an adjacent optical telecom channel. The VECSEL will remain in the same mode until the gain maximum reaches a half-distance between the two adjacent modes. At this point due to ever present perturbations (either spontaneous emissions or mechanical perturbations, for example) the laser will manifest intermittent (mode hopping) behavior. As the gain curve is thermally moved further, the laser will start lasing single mode on arrival at a mode adjacent to the departure mode. This experimental behavior of a non-stabilized VECSEL having a cavity length of 2.5 cm and with an InGaAs active region is shown in FIG. 2. FIG. 2 shows a very stable single mode operation with very low frequency drift approximating 6 MHz per minute, even though the laser case temperature. was not stabilized, and the external mirror spacer was provided by the aluminum base plate. FIG. 2 shows zones of intermittent behavior when the gain maximum is located equidistantly between two adjacent modes. Since the cavity design of the VECSEL of the present invention enables only operation on a particular telecom channel frequency, temperature tuning of this VECSEL provides a very efficient and stable way to tune from one telecom channel to another. Tuning range of this VECSEL depends on the band gap energy dependence of the active zone materials. Temperature tuning coefficient of the laser described in the September 2000 *JOSA-B* paper referred to hereinabove was 045 nm/° C. By changing the temperature set point to the range of ±25° C. with respect to room temperature, a tuning range of approximately 23 nm can be realized.

The spectrum of the laser will reach a stationary state at some time $\tau_{sp}$, which is determined by the spontaneous emission rate into the cavity modes, and it can be found from equation (4):

$$\tau_{sp} \cong \frac{M_0^{st}}{\gamma \xi}, \quad (4)$$

where $M_0^{st}$ is the intensity (photon number) of the central mode, and $\zeta$ is the ratio of the spontaneous emision rate into one laser mode to the stimulated emision rate per photon, which is close to unity. The spectrum of the laser in this stationary state will have a Gaussian shape with a width which can be evaluated from equation (1). If it is assumed that the power output of the VECSEL is 10 mW, then the photon number in the central mode will be $3.10^8$ photons, $\tau_{sp}$ will then be 1.7 seconds, the width of the Gaussian spectral distribution will be 0.17 GHz, and relative intensity of the nearest neighbor to the lasing mode will be $4.7.10^{-5}$, or −43 dB.

Figure 3:
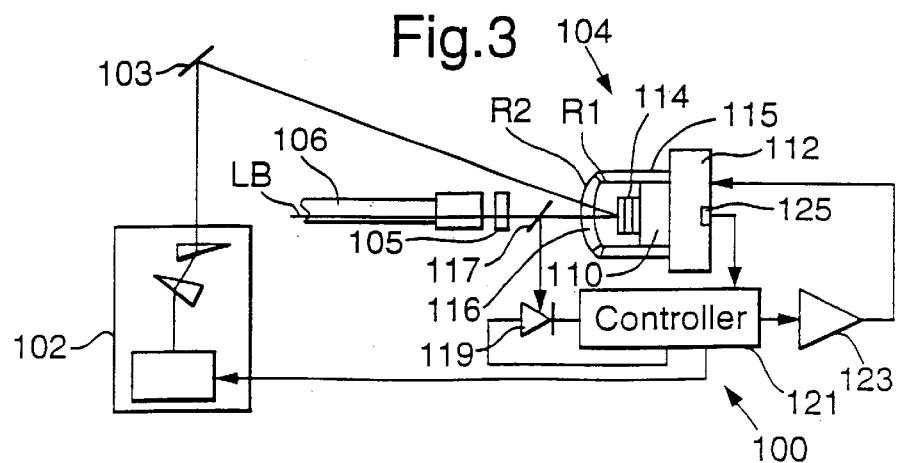
FIG. 3 is a schematic diagram of an optical fiber transmitter unit including an optically pumped MQW VECSEL in accordance with principles of the present invention.

A fiber optic telecommunications transmitter 100 is diagrammatically illustrated in FIG. 3 for putting modulated optical power emitted by a VECSEL 104 into an optical fiber 106 of a communications network operating in the near infrared spectrum, e.g. 1000 nm to 1700 nm and having a multiplicity of spaced apart channels therein, as with 12.5 GHz or 25 GHz adjacent channel spacing. A suitable amplitude modulator 105, such as a lithium niobate crystal, or other electro-optical element or grating having a current-modulated index of refraction, for example, is preferably included in the radiation path of the VECSEL 104 in order to impart the necessary information signal to the VECSEL laser beam before passing into the optical fiber 106.

A laser diode unit 102 puts out optical pumping radiation at a desired wavelength, e.g. 980–1000 nm (1.24 eV at 300K), and power level, e.g. a minimum of 150 mw and typically 500 mW to 1 W. When excited by e.g. 150 mW of pump power, the VECSEL 104 puts out 5 mW in the near infrared spectrum, e.g. 1560 nm, and output power scales up as a function of pump power. A folding mirror 103 may be provided to direct the pump radiation toward the VECSEL 104 which has a relatively short cavity, e.g. on the order of 6 mm, between an intrinsic DBR mirror 126 of a semiconductor structure 114 and an external cavity mirror 116.

Other elements of the VECSEL 104 include a heat sink 110, a thermoelectric cooler 112 for wavelength control (mode selection), and an epitaxially grown inverse semiconductor structure 114 including the antireflection layer 122, the MQW active gain region 124, the DBR mirror layers 126 and metal film mirror layer 128 adjacent heat sink (base plate) 110.

A spacer 115 supports an external mirror 116 in place over the top surface of the semiconductor 114 at a precise distance establishing the VECSEL close spacing in a range between 0.5 mm and 50 mm and approximately 6 mm in the present example. While the spacer shown in FIG. 3 is cylindrical, it may have a variety of geometric shapes and be comprised of a single integral element, or several integral or discrete elements such as posts, pillars, a trough, or any other shape desired for or dictated by a particular application. Thus, the term "spacer" as used herein includes multiple structural elements as well as single integrated structures.

The spacer 115 precisely fixes a VECSEL cavity mode separation to be equal to dense wavelength division multiplex ("DWDM") channel spacing of the optical telecommunications network. The ITU established DWDM telecommunications band at 190 THz, with 25 GHz channel spacing, requires an accuracy of absolute mode positions equal to 2.5 GHz. In order to provide absolute frequency control of each mode equal to ten percent of the nominal channel spacing, a VECSEL cavity length precision on the order of $1.25 \times 10^{-5}$ is required.

The spacer 115 is most preferably formed of a material, such as a molded glass component, (e.g. ULE glass, quartz, Zerodur™ or other glass, or metals such as Invar™ having a low coefficient of thermal expansion) which thermally decouples the external mirror 116 from the semiconductor structure 114, so that temperature regulation of the active region 124 with the thermoelectric unit 112 and heat sink 110 does not change the length of the VECSEL cavity. The spacer material can be selected to compensate for changes in the length of the semiconductor structure 114 when the structure is heated. For example, if the semiconductor structure elongates with temperature, the spacer material is chosen to expand with temperature by an appropriate amount to offset any change in wavelength otherwise resulting. With a spacer made of fused silica having a thermal expansion coefficient $\alpha$ of $10^{-6}$, channel separation will be maintained within a temperature change of plus or minus ten degrees C. Spacer materials such as Zerodur ensure mode positions within temperature changes of plus or minus 100 degrees C. The VECSEL absolute cavity length during manufacture should be reproducible within 0.4 micron. Contemporary optical manufacturing technology can provide thicknesses of optical materials within 0.5 micron. In order to assure that the absolute cavity length is within specification, automatic trimming of the cavity length under optical feedback control is used to meet the required cavity length tolerance.

The external mirror 116 may be a separate element bonded onto the end of the spacer 115, or it may be formed integrally with the spacer. The mirror 116 may be molded to the radius R1 with the aid of a diamond turned metal preform or shaped to a desired spherical contour by any other known method. The mirror surface of structure 116 is of a very high reflectance, and it has a desired spherical radius of curvature R1 relative to the MQW active gain region to define a first highly reflective concave surface. The mirror 116 and the semiconductor structure 104 form a VECSEL cavity having sufficiently high finesse to realize effective single mode lasing operation when appropriately excited by an appropriate energetic level of optical pumping energy. The interior ambient environment of the VECSEL 104 may be dry air, nitrogen, vacuum, or another medium, depending upon an acceptable scattering/absorption tolerance as may be required by a particular application or embodiment.

The external mirror 116 may have an outer curvature of radius R2 forming a coupling lens for focusing the pumping energy into the active region 124 and/or for focusing the VECSEL laser emission beam into the optical fiber 106. Losses in the laser cavity of VECSEL 104 need to be low enough so that the gain of the MQW active region is sufficient to overcome those losses. An external mechanical/optical coupler 108 may be provided to position a fiber end and couple the VECSEL laser beam into the fiber 106. Other laser/fiber coupling arrangements known in the art may also be employed to position and stabilize the components and to couple effectively the VECSEL laser beam into the fiber.

The optical transmitter also preferably includes a beam splitter 117 in the output laser beam path which directs a component of output radiation into a photodetector structure 118. The photodetector provides optical feedback information in the form of electrical signals to a controller 121, most preferably a programmed digital controller. The digital controller 121 generates thermoelectric cooler control signals which are suitably converted into driving currents by an amplifier 123 and applied to control the thermoelectric cooler 121. In some embodiments it may improve performance of the transmitter 100 to include a temperature sensor 125 within the body of thermoelectric cooler 121 and feed sensed temperature values back to the controller 121. The digital controller can also feed back pump laser current control values to the pump laser to control pump radiation to maintain a constant output power out of the VECSEL via higher pump power levels at the edges of the tuning range where VECSEL gain is not as high. The digital controller 121 typically includes analog to digital and-digital to analog conversion circuits well known to those skilled in the art and not included within the FIG. 3 illustration.

We have previously reported that even though the transmission of the DBR mirror of the semiconductor structure is very low, a small amount of the transmitted light reflected from the back side of the substrate can enter the cavity again. This small amount of light can introduce as pectral perturbation which has a form of fringes with the spectral period defined by the optical thickness of the substrate. Such modulation is unwanted and may impede smooth tuning from one mode to another. We have also reported that this effect can be significantly reduced by providing a wedge-shape to the substrate of several degrees. However, for telecom applications, such wedge shape may not be sufficient to remove this artifact because th e VECSEL will operate in a stationary state and the influence of the light scattered from the substrate may prove to be strong enough to perturb smooth tuning from mode to mode.

Figure 4:
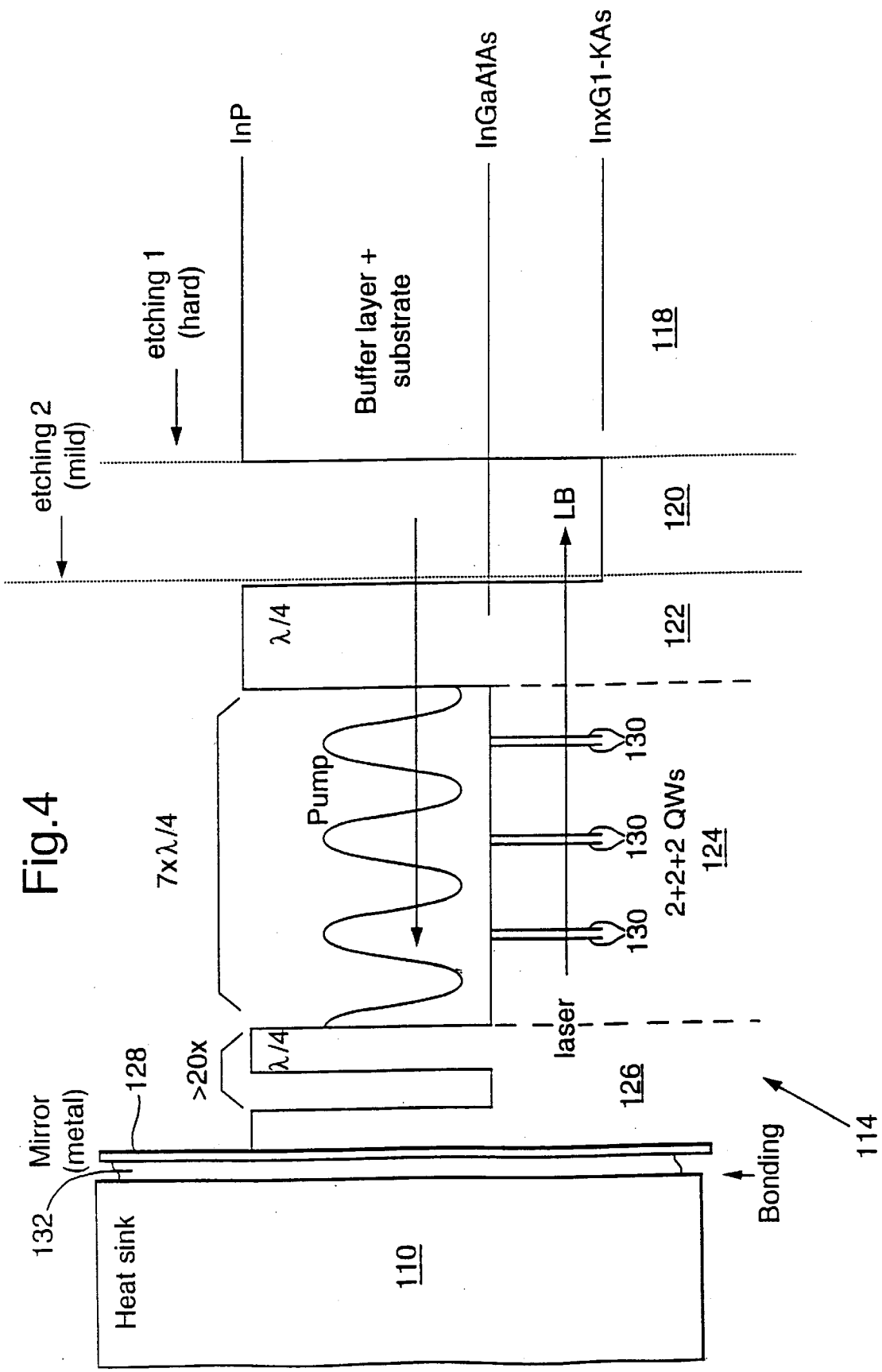
FIG. 4 is a band gap energy diagram superimposed upon a diagrammatic cross section of an epitaxially-grown semiconductor structure preparatory to inverse structure processing into the FIG. 3 VECSEL semiconductor.

In order to exclude completely any optical perturbation from the back side of the substrate, we deposit a non-transparent metal film layer between the DBR and the substrate. In order to make this approach practical, we employ a reverse order epitaxial process in which the epitaxial structure is grown in reverse order. As shown in FIG. 4, for the exemplary telecommunications transmitter 100, the semiconductor structure 114 is grown in reverse order on buffer layer 120 most preferably by molecular beam epitaxy: AR layer 122, then active region 124, then DBR mirror 126 and finally metal film layer 128.

The VECSEL semiconductor structure 114 is most preferably grown on a substrate 118 comprising InP having a buffer layer 120 of $In_xGa_{1-x}As$, where x and 1-x represent chemical mole fractions of the respective elements of the crystalline buffer layer material. As grown in reverse order, the first or bottom layer comprises the antireflection evaporation coating 122 of an $\lambda/4$ thick indium phosphide capping layer and an indium gallium aluminum arsenide layer of a thickness $5\lambda/4$ where lambda represents the VECSEL nominal mid-band output wavelength, 1560 nm, for example. While the indium gallium aluminum arsenide alloy works well for the antireflection layer 122, we have found that a silicon nitride layer provides an effective broad band antireflection coating. The function of the antireflection layer 122 is to prevent reflection within the semiconductor structure at the VECSEL lasing wavelength, as opposed to the pumping wavelength. Since the VECSEL 104 is pumped through the external mirror 116 or through some other lens or opening through spacer 115, the antireflection layer 122 should be of a material selected for minimal absorption of energy at the pump wavelength, so that a maximum pump power will enter the active region, excite the quantum well carriers and yield efficient lasing. For telecommunications it is necessary that the antireflection coating 122 be effective across the entire optical communications band, and not just a single channel.

A positive gain, active region 124, in one example having a length $7 \times \lambda/4$, is then formed and has, for example, three pairs of quantum wells 130 of indium gallium arsenide. While FIG. 4 illustrates an arrangement of pairs of quantum wells 130 with each pair arranged at a peak of the optical standing wave, other arrangements can be employed when optical pumping radiation enters the active gain region 124 via the antireflection coating 122, such as three-two-one. In this alternative arrangement three quantum wells are at an optical peak nearest antireflection coating 122, two are at a middle peak, and one is at a peak distant from the antireflection coating. In the near infrared spectrum quantum wells typically have less gain than in the visible spectrum, and a sufficient number of quantum wells must be provided to yield the needed gain for reliable operation at the desired output power. Each quantum well 130 has a thickness designed in relation to the desired output wavelength at operating temperature (which, because of absorption of the pump energy, will be higher than room temperature). When the active region 124 is pumped, it heats up. When a semiconductor is heated, it changes effective thickness and index of refraction. Accordingly, the emitting wavelength of the quantum wells 130 must be shifted to a higher energy level compared to a room-temperature design wavelength of the structure: $\lambda_{QW}=\lambda_{DESIGN}-20/30$ nm approximately (at T0=300K, at low excitation), so that the gain and the design wavelength match when the VECSEL 104 is lasing.

As shown in the FIG. 4 diagram, each pair of quantum wells 130 is located at a maximum of the active region standing wave. Major separation or barrier layers between the quantum well pairs have a length optimized for an absorption coefficient at the pump radiation wavelength which in this example is 980 nm. FIG. 4 not only shows a diagrammatic cross section of the layers of the semiconductor structure 114, it also plots relative band gap energies of the various semiconductor layers 120, 122, 124, and 126.

A distributed Bragg reflector (DBR) layer stack 126 is then formed on top of the active region. The DBR 126 comprises an odd number of quarter-wavelength interleaved layers, greater than twenty pairs, plus one layer, to achieve an odd number of quarter wavelengths. The DBR layers comprise alternating indium gallium aluminum arsenide, and indium phosphide quarter wave layers, so that total reflectance within the DBR at the design wavelength is greater than 99 percent. Finally, a metal film mirror layer 128 , e.g. gold or gold alloy, is sputter-deposited onto the DBR structure 126 to complete the fabrication of the semiconductor structure within the molecular beam epitaxial process. The metal mirror increases the reflectance from 99 percent to approximately 99.5 percent. Index matching and phase discontinuity issues are essentially avoided by using both the DBR mirror structure 126 and the metal mirror 128.

The effective length between the DBR 126 and the external surface of the antireflection coating 122 is set to an odd number of nominal output quarter wavelengths, so the sub-cavity formed by the semiconductor structure 114 operates in anti-resonance. The pumping energy passes through an antireflection coating 122 to reach an active region 124 of quantum wells.

For a fundamental transverse electromagnetic mode ($TEM_{00}$) operating length of 1560 nm in the near infrared spectrum and at the design operating rapture (300K), the various layers of the semiconductor structure 114 from the gold 128 to the external surface formed at the outer end of the antireflection layer 122 are given in the following table:

| Reference No. | Layer Material | Layer Thickness |
|---|---|---|
| 126 | InP (Phase matched to metal | 901 Angstroms |
| 126 | InGaAlAs (22 layers) | 1117 Angstroms |
| 126 | InP (22 layers) | 1240 Angstroms |
| 124 | InGaAlAs | 1681 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 122 | InGaAlAs | 1231 Angstroms |
| 122 | InP (capping layer) | 500 Angstroms |
| 120 | $In_{0.53}Ga_{0.47}As$ | 3000 Angstroms |
| 120 | InP (buffer layer) | 5000 Angstroms |
| 120 | InP Substrate | |

Figure 5:
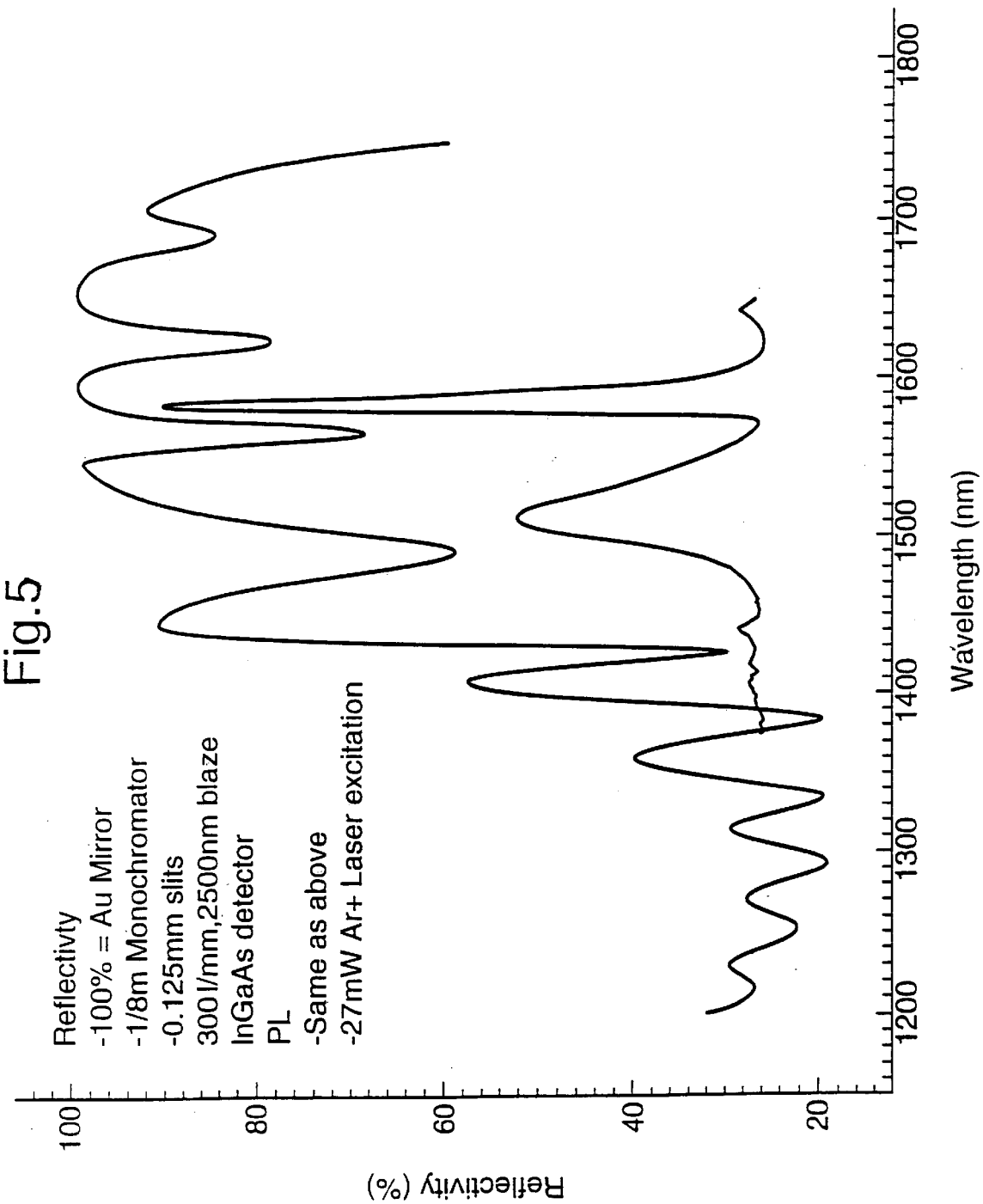
FIG. 5 is a graph of reflectivity (upper trace) and photoluminescence (PL) (lower trace) measurements made of a sample of the FIG. 3 VECSEL indium phosphide semiconductor structure along a wavelength baseline.

FIG. 5 presents a graph superimposing an upper sinuous line representing measured reflectivity of a sample semiconductor structure 114 in accordance with the above table, and a lower sinuous line representing measured photoluminescence of the same sample.

After the epitaxial deposition processes are complete, the indium phosphide substrate 118 is removed by an abrasion step, such as ion beam milling. The indium gallium arsenide buffer layer 120 is then removed by a second step of wet chemical etching with an etching agent which favors removal of the gallium arsenide substrate 120 (rather than the indium phosphide capping layer within the antireflection layer 122). A wafer including multiple ones of semiconductor structures 114 is then diced to yield individual semiconductor dies or "chips".

The metal mirror layer of a said chip 114 is then bonded to a silicon substrate or soldered to a copper heat sink 310. By removing the substrate 320 in this preferred reverse order formation process, thermal control of the active region 324 via the thermoelectric element 312 and the heat sink 310 is much more direct and positive, than if the heat had to be conducted through the substrate, as is the case with conventional VECSEL and VCSEL designs.

For example, within a telecom application, a thermal control loop comprising elements 117, 119, 121, 123, 112 and 125 shown in the FIG. 3 example is most preferably employed to establish and maintain a central or reference wavelength within a multi-channel optical band. As shown in the FIG. 1 graph, the VECSEL 100 will lase on a mode closest to gain maximum. When the temperature of the quantum well active region 124 is changed, the maximum of the gain shifts with a tuning of approximately 30 GHz/ degree C. This tuning range suggests that if the temperature of the gain structure is kept stable within 0.1 degree C., such thermal regulation will ensure that the VECSEL will be lasing on a single selected mode. This approach avoids the drawbacks of absolute temperature control required for DFB lasers presently operating in the optical fiber telecommunications industry.

As shown in FIG. 2, when the gain maximum is thermally tuned to a position corresponding to the middle between two adjacent modes, the VECSEL 104 will intermittently lase on one or the other mode. If the laser is alternating between two modes, such alternation can be detected by providing the photodiode assembly 119 with frequency selectivity-filtering characteristics. By thermally tuning the telecommunications VECSEL 104 over the entire frequency range, it is practical to detect all set points corresponding to gain positions exactly between the modes. These positions are then stored in the digital control unit 121 enabling an exact match between temperature set points and the DWDM channel to be computed and presented to the active gain region 124 via the thermoelectric cooling unit 112. This particular method enables thermal compensation over time for changes in the semiconductor structure materials of the VECSEL 104 due to material aging, for example. The digital control unit 121 also controls an adiabatic startup sequence at the pump laser 102 and regulates pump power during steady state operation, so that the VECSEL 104 is started single mode and remains single mode during operation.

The intermittent, mode hopping behavior shown in FIG. 2 is most preferably used to determine automatically the relationship between temperature set points and telecom channel numbers. The temperature set points should correspond to the situation where the gain curve maximum coincides exactly with the corresponding mode, as illustrated in FIG. 1. As seen in FIG. 2 the intermittent laser behavior takes place when the gain maximum is located exactly between two modes, and that the temperature range corresponding to such intermittent behavior is significantly smaller than the temperature increment necessary to move the laser from one mode to its nearest neighbor mode. Thus, these temperature set points can be determined with a very high precision by observing the laser output with the monitor photodiode 117 which has in front of it a filter having an optical transmission gradient which varies from a low, few percent, value to a high, near 100 percent, value across the telecom wavelength range. With such a detector, which is AC coupled to the controller 121, the jumping of the laser from mode to mode will result in intense random spikes (mode transitions) which produce digitized values and intervals readily detected by the digital unit 121.

A presently preferred method for laser self-calibration is as follows:

The control unit 121 sets the laser temperature set point to its lowest negative value causing the thermoelectric cooler 112 to reach its lowest nominal operating temperature. Then, the control unit 121 causes the temperature to increase over a calibration time interval. The control unit 121 constantly monitors laser output to detect mode transitions, and it records the temperature control parameter for that particular transition in memory, most preferably a non-volatile electrically rewriteable memory within controller 121, such as a "flash" memory element or array. This operation of detecting mode transitions and recording thermal control parameters continues until a maximum positive temperature set point is reached. The control value for the first mode is then given the value of one half the first thermal control parameter, the control value for the next mode is then determined as a value of one half between the first and second control parameters, the control value for the third mode is then determined as a value of one half between the second and third recorded control parameters, and so forth, until all control values within the thermal control range are determined. This dependence can be expressed as a low order polynomial such as Ut(n), where Ut is for example the control voltage input to the thermoelectric cooler 112. Then, the control value of the temperature control (corresponding e.g. to voltage or current) for the first telecom channel accessible by this particular laser will be found as Ut(1), the control value for the second telecom channel will be Ut(2), etc., and finally the control value for the last telecom channel accessible by this particular laser will be found as Ut(N). Obviously, Ut(0.5), Ut(1.5), etc., are the set points corresponding to the gain curve equidistant between the adjacent modes. Finally, absolute wavelength of the first operating channel for the particular laser is determined and recorded in the controller memory (and externally as part of documentation accompanying this particular laser) at the factory by use of an optical spectrum analyzer, such as a Burleigh WA-7100. Once calibrated, the laser will keep the values for a long time. The distance in wavelength units between two telecom channels with 25 GHz channel spacing is 0.195 nm. Provided that the laser temperature tuning coefficient is about 0.45 nm/° C., the tuning from one telecom channel to another will require about 0.4° C. temperature increment. In order to keep the laser operating at the chosen channel frequency, a very reasonable temperature tolerance of 0.1° C. is sufficient.

After the laser leaves the factory, the automatic calibration of the laser can be repeated in the field or operating environment at any time, and any correction to temperature control values (polynominal coefficients) can be refreshed by the control unit 121 and replaced in memory. No measurement by a spectrum analyzer would be required unless initial laser calibration data is completely lost. This method enables each laser to be maintained in a calibrated state for an arbitrarily long time, expected to approach closely the full useful life of the laser device.

Figure 6:
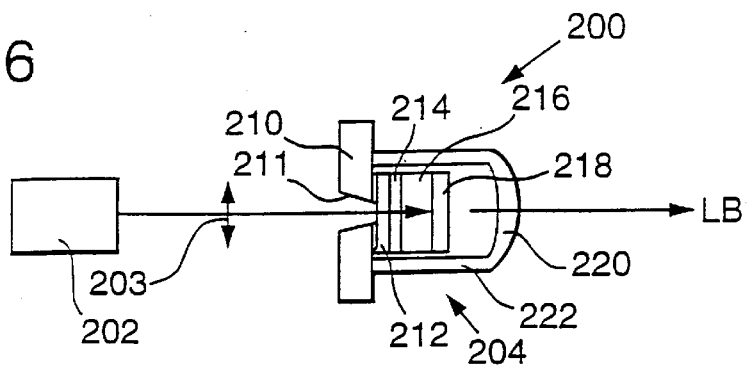
FIG. 6 is a schematic diagram of another optical fiber transmitter unit including an optically pumped MQW VECSEL in accordance with principles of the present invention.

While the VECSEL 104 shown in FIG. 3 is presently preferred because of its relative simplicity of manufacture, other VECSEL arrangements and configurations are within the scope of the present invention. In FIG. 6, a VECSEL-based telecommunications transmitter 200 includes a laser diode pump 202, a pump beam focus lens 203, and a VECSEL 204. In this configuration, the pump energy enters one side of the VECSEL 204, and the laser energy exits another side of the VECSEL 204. A base 210, made of thermally conductive material such as copper, defines a pump aperture 211. A thermoelectric cooler such as cooler 112 (not shown in FIG. 6) automatically controls temperature of the base 210. A semiconductor structure, formed in reverse order in the same manner as the FIG. 3 VECSEL 104, has a pump-transparent dielectric mirror layer 214, an active gain region 216 and an antireflection coating 218. An external surface of the dielectric mirror layer 214 is polished very smooth and is bonded to a transparent substrate layer 212, such as diamond, by a suitable bonding method or agent. Vacuum bonding by VanDerWalls forces, or peripheral soldering with a solder material, such as indium, is preferred. Since the external lens 220 and spacer 222 are equivalent to the lens and spacer of the VECSEL 304, the explanations given above for those elements apply to the elements 220 and 222. With suitable modifications made clear by the foregoing explanations of structure and function of respective elements, the pump laser radiation could enter the active region of VECSEL 204 via the external mirror 220, and the laser radiation could exit via the aperture 211.

Figure 7:
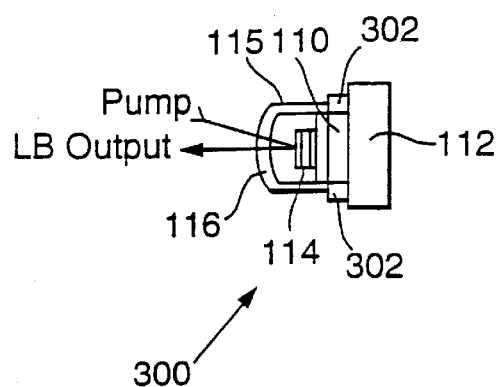
FIG. 7 is a schematic diagram of a MQW VECSEL similar to the FIG. 3 MQW VECSEL with the addition of an annular piezoelectric element for providing micro adjustment of the external cavity length, thereby adding a further wavelength tuning mechanism having a shorter time constant than achievable with thermal tuning.

In cases when single wavelength operation and discrete step-tuning is not necessary, such as in spectroscopy for example, the spacer, instead of being formed of low thermal expansion materials may be made of a material'that changes its dimension under external stimulation, such as a piezoelectric transducer or changes in external ambient pressure. FIG. 7 shows a MWQ VECSEL 300 in accordance with these principles. VECSEL 300 is similar in structure to VECSEL 104 shown in, and described in conjunction with, FIG. 3, so that common elements bear the same reference numerals and the previous descriptions of those elements apply to the FIG. 7 structure. However, in VECSEL 300 an annular piezoelectric element 302 is sandwiched between the base 110-heatsink 112 and the spacer 115. In this case the VECSEL cavity length can be made even shorter, e.g. 1 mm or a few hundred microns, and the laser will provide single-frequency mode-hop tuning over several $cm^{-1}$. In this regard it is important that the piezoelectric element 302 apply a uniform force around its circumference, so that the external mirror 116 remains on the optical axis of VECSEL 300 as the cavity is lengthened and shortened.

Alternatively, if the external mirror is coupled to a piezoelectric transducer, the VECSEL will work as a tunable single frequency source. The mode hop free tuning range will be close to the cavity mode spacing, 25 GHz for a cavity length of 0.6 cm. If the cavity length is reduced to about 1 mm for example, the mode hop free tuning range (without synchronous MQW structure temperature tuning) will be 150 GHz, or 5 $cm^{-1}$, which makes the resultant VECSEL a very good source for spectroscopic and gas analysis applications.

Figure 8:
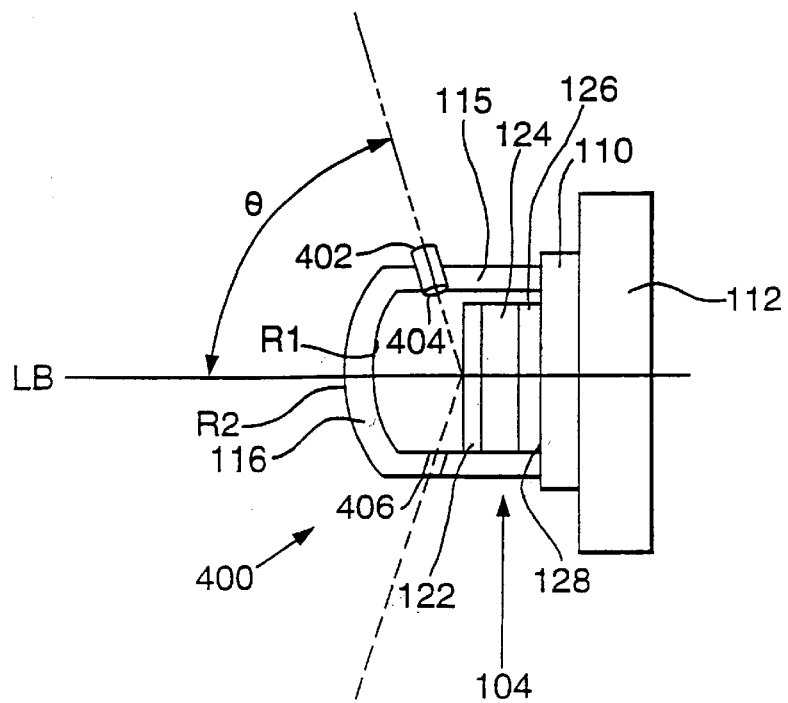
FIG. 8 is a greatly enlarged schematic diagram of a MQW VECSEL similar to the FIG. 3 MQW VECSEL in which a 150 mW DFB diode laser is mounted and aligned to illuminate the VECSEL semiconductor structure at Brewster's angle, in accordance with principles of the present invention.

A further cost-saving improvement can be realized by use of a conventional DFB laser diode pump for directing optical pump radiation at the surface of the semiconductor at an angle of incidence equal to Brewster's angle ($\theta$) and with a correct P polarity which maximizes absorption of pump radiation into the semiconductor structure 114 and minimizes reflection at the surface thereo. This arrangement is illustrated in FIG. 8 which shows a MWQ VECSEL 400 in accordance with these principles. VECSEL 400 is similar in structure to VECSEL 104 shown in, and described in conjunction with, FIG. 3, so that common elements bear the same reference numerals and the previous descriptions of those elements apply to the FIG. 8 structure. In the FIG. 8 arrangement 400, a miniature DFB diode laser assembly 402 is aligned and secured within an opening of the spacer 115 of VECSEL 400 so that pump radiation is directed with correct P polarity at the external surface of the semiconductor structure 104 at Brewster's angle ($\theta$) i.e., 73.6 degrees. A micro-lens 404 may be included within the DFB laser assembly 402 to collimate the pump beam and limit spot size to between 50 and 70 microns, for example. It is known that directing a pump beam from a DFB diode laser having a three to one ellipticity at an angle of incidence equal to Brewster's angle and with proper P polarization, the ellipticity turns into a circular mode at the surface and mode mismatches between the pump laser beam and the semiconductor are thereby minimized. In this manner the DFB diode laser assembly 402 need only emit at a power level of 150 mW to obtain the equivalent pump efficiency requiring a 1 watt laser pump having a beam not incident at Brewster's angle. 150 mW DFB diode lasers emitting at 980 nm wavelengths are readily available at low cost, from sources such as Mitsubishi. The pump assembly 402 may include its own integral heat sink and thermoelectric cooler in order to facilitate thermal control of wavelength in addition to direct current control, if desired for a particular application.

The arrangement shown in FIG. 8 is presently preferred as it enables the DFB diode pump laser 402 to be aligned and fixed in place in the factory as part of the VECSEL assembly process and then checked out before delivery to a user. In the event that a small portion of pump energy is reflected by the outer surface of the semiconductor 104, an aperture or other pump-energy absorbing means 406, may be defined in an opposite position in the spacer 115 to prevent or impede further reflection of pump energy within the external cavity of the VECSEL.

As pointed out above, the spacer can be manufactured within a 1µ tolerance. During manufacturing it is necessary to make a final adjustment of spacer length so that it meets the required 0.04µ tolerance in order for the laser mode spacing to equal the telecom channel spacing. This fine adjustment is also required in order to assure that the absolute frequency of any given mode is within the required tolerance equal to the absolute frequency of the telecom channel closest to this mode. It does not matter which mode is tuned to the nearest telecom channel providing the mode spacing corresponds correctly with the telecom channel comb. The channel number can be adjusted in the processor unit 121.

To perform the fine adjustment of the spacer, the VECSEL should be switched on so that it lases single frequency at some mode. Its output radiation is sent to a spectrum analyzer, such as a Burleigh WA-7100 spectrum analyzer, or equivalent, which provides a wavelength measurement accuracy of ±1.5 ppm or ±0.19 GHz. The spectrum analyzer will display the actual lasing frequency.

Figure 9:
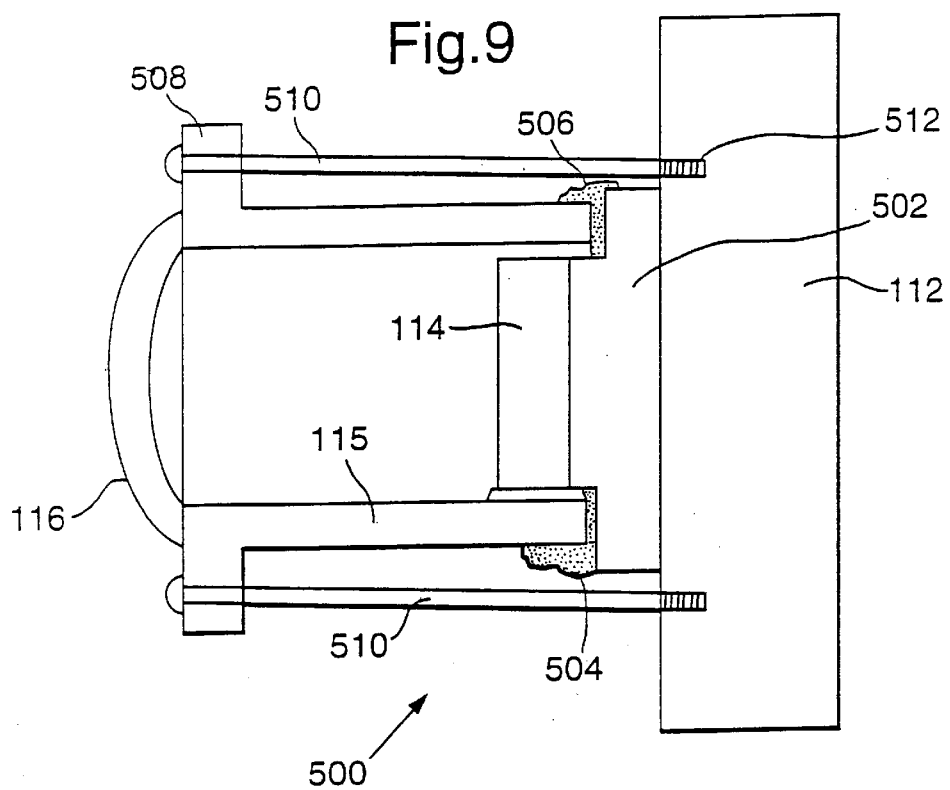
FIG. 9 is a greatly enlarged schematic diagram of a MQW VECSEL similar to the FIG. 3 MQW VECSEL illustrating one preferred arrangement for precisely aligning and securing the external mirror spacer to the heat sink to achieve the cavity precision design length.

With reference to FIG. 9, the mirror 116 is fixed to the spacer 115 in such a way that the border of its spherical surface is sitting on the polished flat surface of the cylindrical spacer. The mirror 116 in a suitable fixture, such as a spring loaded mount, so that by adjustment of the spring, the spacer can be axially displaced relative to a base plate 502 or given a small elastic deformation. The base plate 502 may be provided with a recessed or flanged region 504 sized to present a small interference with the spacer 115 so that the spacer is initially maintained at a starting position. Adjustment of 1µ along the longitudinal axis of the VECSEL 500 while monitoring the spectrum analyzer can readily be made in this manner. Once the spacer is precisely adjusted to provide the external cavity with its precisely correct length, it is securely bonded to the base plate in this position by a bonding agent 506, such as low temperature glass, solder, UV-curable resin system, or the like, (which may be heated and flowed or reflowed incident to this adjustment). Fixing a final position may be achieved by post-tensioning the spacer 115 with three or more tensile members or posts 510 which are automatically adjustably tensioned by computer control in the factory between a flange 508 of the spacer and fine-pitched threaded openings formed in the base plate 112. Other arrangements, such as maintaining a spring bias force on the spacer may be employed with slightly greater mechanical complexity in the completed VECSEL 500.

With some added structural and fabrication complexity, an additional electro-optical control element, such as a thin dielectric tilted etalon having dielectric partial reflective coatings for example, can be included within the VECSEL cavity. Such an etalon will work as a bandpass filter, and it will reduce effective gain bandwidth, thus reducing the time necessary to reach a single frequency operation and increasing the side mode suppression. The etalon transmission peak should be close to the gain maximum. The tuning of the etalon may be achieved by changing its temperature using a separate thermoelectric cooler element or by changing its tilt angle with a piezoelectric control element, for example. Correspondence between etalon temperature/tilt angle and selected channel can be established using a procedure similar to the calibration procedure set out hereinabove. Such an additional element or controllable wavelength filter enables more rapid selection/control of VECSEL emission wavelength than may be realized by thermal control only of the VECSEL active region 114. In addition the intra-cavity element may be provided to speed up single mode operation and further reduce the possibility that the laser will laser multimode during startup. The closest cavity mode to the transmission peak of this element becomes the chosen operational mode. As the DWDM channel separation is $10^{-4}$ of the telecom channel frequency, positioning of the intra-cavity element's optical peak has to be made with an accuracy of a few percent of the free spectral range, and this is readily reproducible with contemporary optical manufacturing techniques. Rapid tuning to a particular channel wavelength can then be carried out by the intra-cavity electro-optical element which effectively changes the cavity length in a controlled manner correlated to the selected channel wavelength. In this manner, from 500 to 1000 separate channels can be realized over a 200 nm VECSEL laser radiation wavelength tuning range centered at e.g. a 1560 nm wavelength.

Figure 10:
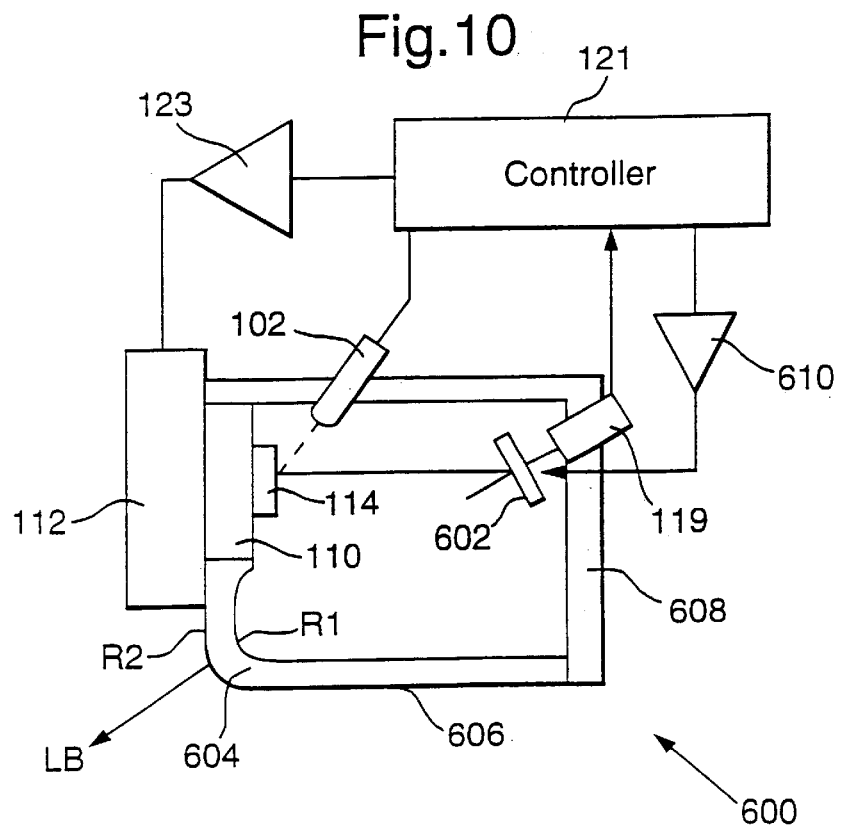
FIG. 10 is a greatly enlarged schematic diagram of a MQW VECSEL incorporating principles of the present invention and further including an intra-cavity etalon enabling rapid mode selection.

FIG. 10 sets forth a greatly enlarged schematic diagram of a VECSEL 600 including an intra-cavity element 602 forming a mirror for reflecting optical energy emitted by the semiconductor structure 114 to a spherical mirror 604. A two-part spacer includes a generally cylindrical body 606 which defines the mirror 604, and further includes a plate 608 which aligns and secures the intra-cavity element 602. The etalon 602 may be partially transmissive, and the monitor photodiode 119 then can be mounted to the plate 608 behind the etalon 602. The controller 121 includes an etalon driver 610 for driving either a thermoelectric cooler or a piezoelectric transducer which controls the etalon 602 in the manner described above.

Those skilled in the art will appreciate that many changes and modifications will become readily apparent from consideration of the foregoing descriptions of preferred embodiments without departure from the spirit of the present invention, the scope there of being more particularly pointed out by the following claims. The descriptions herein and the disclosures hereof are by way of illustration only and should not be construed as limiting the scope of the present invention.

What is claimed is:

1. An optically pumped single mode vertical external cavity surface emitting laser having a design wavelength, the laser comprising:
   a heat sink structure;
   a semiconductor structure grown by molecular beam epitaxy upon a substrate, which structure comprises:
      a multi-layer Bragg reflector having at least 90 percent reflectance; and
      a homogeneously broadened active gain region comprising multiple quantum wells, the gain region having a length equal to at least one design wavelength;
   at least one external mirror means having a curved face confronting the semiconductor structure along an optical axis; and
   spacer means in thermal communication with the heat sink structure for positioning and supporting the at least one external mirror means relative to the semiconductor structure at a distance selected to create a laser frequency comb corresponding to a predetermined optical channel spacing arrangement.

2. The laser set forth in claim 1 wherein said homogeneously broadened active gain region has a gain curve exceeding cavity losses over a band having a band width which is less than a mode-to-mode spacing, said gain region being tunable to step from a first mode to a second mode and to remain stably at the second mode.

3. The laser set forth in claim 1 wherein said multi-layer Bragg reflector comprises an epitaxially deposited semiconductor.

4. The laser set forth in claim 1, further comprising a plurality of dielectric layers, with each dielectric layer having a thickness substantially equal to a quarter of said design wavelength and the plurality of dielectric layers being positioned adjacent to said multi-layer Bragg reflector.

5. The laser set forth in claim 1 wherein said semiconductor structure further comprises an antireflection region associated with said gain region.

6. A single mode vertical external cavity surface emitting laser having a design wavelength and being adapted for receiving optical pump energy from a laser pump beam incident on the laser from a direction angularly adjacent to a laser output beam axis, the surface emitting laser comprising:
 a heat sink structure;
 a metal mirror layer in thermal communication with the heat sink structure;
 a semiconductor structure grown by molecular beam epitaxy upon a substrate, the semiconductor structure comprising:
  a multi-layer semiconductor mirror region adjacent to the metal mirror layer, the mirror region and metal mirror layer being configured to achieve a combined reflectance of at least 99 percent;
  a homogeneously broadened active gain region comprising multiple quantum wells, the gain region having a thickness equal to at least one design wavelength, the multiple quantum wells including plural pairs of quantum wells, each pair being located at a peak amplitude of a standing wave present in the gain region at the design wavelength; and
  an antireflection coating positioned on a selected region of the multi-layer semiconductor mirror and having a low reflectance at the design wavelength;
  at least one external mirror means facing, and spaced apart from, the antireflection coating at a distance in a range of 0.5 to 10 mm and configured to create a laser frequency comb corresponding to a predetermined optical channel spacing arrangement to thereby define an external cavity; and
  spacer means, also in thermal communication with the heat sink structure, for positioning and supporting the external mirror means.

7. An optically pumped single mode vertical external cavity surface emitting laser having a design wavelength, the laser comprising:
 a transparent heat sink structure;
 a semiconductor structure in thermal communication with the heat sink structure and comprising:
  a multi-layer semiconductor mirror region providing at least 99 percent reflectance;
  a homogeneously broadened active gain region comprising multiple quantum wells, the gain region having a length equal to at least one design wavelength; and
  an antireflection coating positioned on a selected region of the multi-layer semiconductor mirror and having a low reflectance at the design wavelength;
 external mirror means; and
 spacer means in thermal communication with the heat sink structure for supporting the external mirror means and positioning the external mirror means relative to the semiconductor structure at a separation distance in a range of 0.5 mm to 50 mm, the separation distance being chosen to create a laser frequency comb corresponding to a predetermined optical channel spacing arrangement to form and thereby define an external cavity, such that at least one of an optical pump beam at a pump wavelength and a laser beam at a design wavelength can pass through the heat sink structure.

8. An optically pumped single mode vertical external cavity surface emitting laser having a design wavelength and comprising:
 a heat sink structure;
 a thermoelectric cooling/heating structure in thermal communication with the heat sink structure;
 a semiconductor structure in thermal communication with the heat sink structure and comprising:
  a multi-layer semiconductor mirror structure providing at least 99 percent reflectance;
  a homogeneously broadened active gain region comprising multiple quantum wells, the gain region having a length equal to at least one design wavelength; and
  an antireflection coating positioned on a selected region of the multi-layer semiconductor mirror and having a low reflectance at the design wavelength;
 the thermo-electric cooling/heating structure controlling the operating temperature of the multiple quantum well gain structure to provide single mode to single mode tuning of the laser;
 external mirror means; and
 spacer means in thermal communication with the heat sink structure for supporting the external mirror means and positioning the external mirror means relative to the semiconductor structure at a separation: distance in a range of 0.5 mm to 50 mm, the separation distance being chosen to create a laser frequency comb corresponding to a predetermined optical channel spacing arrangement.

9. An optically pumped single mode vertical external cavity surface emitting laser having a design wavelength and comprising:
 a heat sink structure;
 a semiconductor structure in thermal communication with the heat sink structure and comprising:
  a multi-layer semiconductor mirror structure achieving at least 99 percent reflectance;
  a homogeneously broadened active gain region comprising multiple quantum wells, the gain region having a thickness equal to at least one design wavelength; and
  an antireflection coating positioned on a selected region of the multi-layer semiconductor mirror and having a low reflectance at the design wavelength;
 external mirror means;
 a piezoelectric element in thermal communication with the heat sink structure, and
 spacer means mounted on the piezoelectric element for aligning and supporting the external mirror means relative to the semiconductor structure at a distance in a range of 0.5 mm to 50 mm to form an external cavity and said distance being chosen to create a laser frequency comb corresponding to a predetermined optical channel spacing arrangement, the piezoelectric element being adapted to change an optical length of the external cavity, thereby tuning the wavelength of the laser.

10. An optically pumped single mode vertical external cavity surface emitting laser having a design wavelength and comprising:
- a heat sink structure;
- a semiconductor structure grown by molecular beam epitaxy upon a substrate, the semiconductor structure comprising:
  - a multi-layer semiconductor mirror region achieving at least 99 percent reflectance;
  - a homogeneously broadened active gain region comprising multiple quantum wells, the gain region having a length equal to at least one design wavelength; and
  - an antireflection coating positioned on a selected region of the multi-layer semiconductor mirror and having a low reflectance at the design wavelength;
- external mirror means;
- spacer means, in thermal communication with the heat sink structure, for supporting the external mirror means and positioning the external mirror means relative to the semiconductor structure at a separation distance in a range of 0.5 mm to 50 mm, the separation distance being chosen to create a laser frequency comb corresponding to a predetermined optical channel spacing arrangement to thereby form a vertical external cavity of the laser; and
- laser diode pump means providing pump radiation aligned relative to an external surface of the semiconductor at an angle corresponding to Brewster's angle relative to an axis of laser emission.

11. The optically pumped single mode vertical external cavity surface emitting laser set forth in claim 10, wherein said laser diode pump means is a sub-assembly which is aligned and secured in a sidewall of said spacer means.

12. The optically pumped single mode vertical external cavity surface emitting laser set forth in claim 11, further comprising pump radiation absorption means, formed in said spacer means at an angle corresponding to Brewster's angle opposite an angle of incidence of said pump radiation for absorbing any of said pump radiation reflected from said external surface of said semiconductor.

13. A single mode vertical external cavity surface emitting laser having an external cavity formed by an external mirror fixed by a spacer, the cavity length defining a plurality of optical modes, each mode corresponding to a channel wavelength of an optical telecommunications system having plural optical channels, and having an optical-pump-excited, homogeneously broadened gain region active over a wavelength band having a band width less than mode-to-mode spacing, the gain region being tunable from a first mode to a second mode and being stable over time at the second mode, and tuning means for tuning the laser from mode to mode and for maintaining the laser at a selected mode, thereby to select each one of the plural optical channels.

14. The single mode vertical external cavity surface emitting laser set forth in claim 13, wherein said tuning means comprises a thermoelectric cooler controlled by a digital controller.

15. The single mode vertical external cavity surface emitting laser set forth in claim 13, wherein said tuning means comprises an intra-cavity etalon controlled by a digital controller.

16. A method for making a semiconductor structure for use as an integral component of an optically pumped vertical external cavity surface emitting laser responsive to optical energy at an optical pump wavelength, where the laser emits laser radiation at a design wavelength longer than the pump wavelength, the method comprising the steps of:
- forming by molecular beam epitaxy a semiconductor structure comprising a plurality of semiconductor crystalline layers upon a substrate, the semiconductor structure comprising:
  - a multi-layer high reflectance mirror region;
  - a multi-layer active gain region having a plurality of quantum wells, the gain region having a length equal to at least the design wavelength; and
  - an antireflection coating positioned on a selected region of the multi-layer mirror region and having a low reflectance at the design wavelength;
- removing the substrate to thereby provide the formed semiconductor structure; and
- providing a heat sink structure in thermal communication with the formed semiconductor structure;
- the formed semiconductor structure having an effective length at the design wavelength corresponding to an odd integer number of wavelengths relative to the design wavelength to thereby operate as a sub-cavity in anti-resonance at the. design wavelength of the laser.

17. An optically pumped single mode vertical external cavity surface emitting laser having a design wavelength and comprising:
- a heat sink structure;
- a semiconductor structure grown by molecular beam epitaxy upon a substrate, the semiconductor structure comprising:
  - a multi-layer Bragg reflector achieving at least 99 percent reflectance; and
  - a homogeneously broadened, active gain region comprising multiple quantum wells, the gain region having a length equal to at least one design wavelength;
- a first reflective surface confronting the semiconductor structure along a first optical axis and a second reflective surface having a curved face confronting the first reflective surface along a second optical axis; and
- spacer means in thermal communication with the heat sink structure for positioning and supporting both of the first and second reflective surfaces at a distance selected to create a laser frequency comb corresponding to a predetermined optical channel spacing arrangement.

18. The laser set forth in claim 17, wherein said first reflective surface comprises a mode-selecting intra-cavity etalon.

* * * * *